(12) United States Patent
Liu et al.

(10) Patent No.: US 7,977,249 B1
(45) Date of Patent: Jul. 12, 2011

(54) METHODS FOR REMOVING SILICON NITRIDE AND OTHER MATERIALS DURING FABRICATION OF CONTACTS

(75) Inventors: Xinye Liu, Sunnyvale, CA (US); Yu Yang, Santa Clara, CA (US); Chiukin Steven Lai, Sunnyvale, CA (US)

(73) Assignee: Novellus Systems, Inc., San Jose, CA (US)

( * ) Notice: Subject to any disclaimer, the term of this patent is extended or adjusted under 35 U.S.C. 154(b) by 796 days.

(21) Appl. No.: 12/074,912

(22) Filed: Mar. 7, 2008

Related U.S. Application Data (60) Provisional application No. 60/905,782, filed on Mar. 7, 2007.

(51) Int. Cl.
  *H01L 21/302* (2006.01)
  *H01L 21/461* (2006.01)
(52) U.S. Cl. .......................................... 438/724; 216/79
(58) Field of Classification Search .................. 438/724, 438/757; 216/79, 99, 109
  See application file for complete search history.

(56) References Cited

U.S. PATENT DOCUMENTS

| | | | |
|---|---|---|---|
| 4,414,069 A | 11/1983 | Cuomo | |
| 4,695,327 A | 9/1987 | Grebinski | |
| 4,756,794 A | 7/1988 | Yoder | |
| 5,030,319 A | 7/1991 | Nishino et al. | |
| 5,268,069 A | 12/1993 | Chapple-Sokol et al. | |
| 5,282,925 A | 2/1994 | Jeng et al. | |
| 5,474,641 A | 12/1995 | Otsuki et al. | |
| 5,505,816 A | 4/1996 | Barnes et al. | |
| 5,636,320 A | 6/1997 | Yu et al. | |
| 5,766,971 A | 6/1998 | Ahlgren et al. | |
| 5,792,275 A | 8/1998 | Natzle et al. | |
| 5,838,055 A | 11/1998 | Kleinhenz et al. | |
| 5,876,879 A | 3/1999 | Kleinhenz et al. | |
| 5,968,279 A | 10/1999 | Maclcish et al. | |

(Continued)

FOREIGN PATENT DOCUMENTS

EP 298879 A1 * 1/1989

(Continued)

OTHER PUBLICATIONS

Liu et al., "Adsorption Based Material Removal Process," Novellus Systems, Inc., U.S. Appl. No. 11/479,812, filed Jun. 30, 2006.

(Continued)

*Primary Examiner* — Roberts Culbert
(74) *Attorney, Agent, or Firm* — Weaver Austin Villeneuve & Sampson LLP (57) ABSTRACT

Methods for removing silicon nitride and elemental silicon during contact preclean process involve converting these materials to materials that are more readily etched by fluoride-based etching methods, and subsequently removing the converted materials by a fluoride-based etch. Specifically, silicon nitride and elemental silicon may be treated with an oxidizing agent, e.g., with an oxygen-containing gas in a plasma, or with $O_2$ or $O_3$ in the absence of plasma to produce a material that is more rich in Si—O bonds and is more easily etched with a fluoride-based etch. Alternatively, silicon nitride or elemental silicon may be doped with a number of doping elements, e.g., hydrogen, to form materials which are more easily etched by fluoride based etches. The methods are particularly useful for pre-cleaning contact vias residing in a layer of silicon oxide based material because they minimize the unwanted increase of critical dimension of contact vias.

20 Claims, 3 Drawing Sheets

U.S. PATENT DOCUMENTS

| | | | |
|---|---|---|---|
| 5,976,973 | A | 11/1999 | Ohira et al. |
| 5,994,240 | A | 11/1999 | Thakur |
| 6,071,815 | A | 6/2000 | Kleinhenz et al. |
| 6,074,951 | A | 6/2000 | Kleinhenz et al. |
| 6,335,261 | B1 | 1/2002 | Natzle et al. |
| 6,573,181 | B1 | 6/2003 | Srinivas et al. |
| 6,652,713 | B2 | 11/2003 | Brown et al. |
| 6,706,334 | B1 | 3/2004 | Kobayashi et al. |
| 6,726,805 | B2 | 4/2004 | Brown et al. |
| 6,776,874 | B2 | 8/2004 | Kobayashi et al. |
| 6,790,733 | B1 | 9/2004 | Natzle et al. |
| 6,803,309 | B2 | 10/2004 | Chou et al. |
| 6,817,776 | B2 | 11/2004 | Colgan et al. |
| 6,837,968 | B2 | 1/2005 | Brown et al. |
| 6,852,584 | B1 | 2/2005 | Chen et al. |
| 6,858,532 | B2 | 2/2005 | Natzle et al. |
| 6,905,965 | B2 | 6/2005 | Subrah et al. |
| 6,926,843 | B2 | 8/2005 | Cantell et al. |
| 6,951,821 | B2 | 10/2005 | Hamelin et al. |
| 6,967,167 | B2 | 11/2005 | Geiss et al. |
| 6,992,011 | B2 | 1/2006 | Nemoto et al. |
| 7,029,536 | B2 | 4/2006 | Hamelin et al. |
| 7,079,760 | B2 | 7/2006 | Hamelin et al. |
| 2001/0016226 | A1 | 8/2001 | Natzle et al. |
| 2002/0106908 | A1 | 8/2002 | Cohen et al. |
| 2003/0029568 | A1 | 2/2003 | Brown et al. |
| 2003/0134038 | A1 | 7/2003 | Paranjpe |
| 2004/0018740 | A1 | 1/2004 | Brown et al. |
| 2004/0083977 | A1 | 5/2004 | Brown et al. |
| 2004/0182324 | A1 | 9/2004 | Wallace et al. |
| 2004/0184792 | A1 | 9/2004 | Hamelin et al. |
| 2004/0185670 | A1 | 9/2004 | Hamelin et al. |
| 2004/0200244 | A1 | 10/2004 | Hung et al. |
| 2005/0056370 | A1 | 3/2005 | Brown et al. |
| 2005/0101130 | A1 | 5/2005 | Lopatin et al. |
| 2005/0106877 | A1 | 5/2005 | Elers et al. |
| 2005/0205110 | A1 | 9/2005 | Kao et al. |
| 2005/0218113 | A1 | 10/2005 | Yue |
| 2005/0218507 | A1 | 10/2005 | Kao et al. |
| 2005/0221552 | A1 | 10/2005 | Kao et al. |
| 2005/0230350 | A1 | 10/2005 | Kao et al. |
| 2005/0266684 | A1 | 12/2005 | Lee et al. |
| 2005/0270895 | A1 | 12/2005 | Strang |
| 2006/0051966 | A1 | 3/2006 | Or et al. |

FOREIGN PATENT DOCUMENTS

| | | |
|---|---|---|
| WO | 04/001809 | 12/2003 |

OTHER PUBLICATIONS

U.S. Office Action mailed Dec. 5, 2007 from U.S. Appl. No. 11/479,812.

U.S. Office Action mailed Jul. 17, 2007 from U.S. Appl. No. 11/479,812.

U.S. Office Action mailed May 2, 2007 from U.S. Appl. No. 11/479,812.

U.S. Final Office Action mailed May 7, 2008 from U.S. Appl. No. 11/479,812.

T. Meguro et al., "Digital etching of GaAs: New approach of dry etching to atomic ordered processing", Apr. 16, 1990, American Institute of Physics pp. 1552-1554.

S.D. Park et al. "Atomic Layer Etching of Si(100) and Si(111) Using Cl2 and Ar Neutral Beam", Electrochemical and Solid-State Letters, 8 (8) C106-C109 (2005).

H. Ogawa et al., "Dry Cleaning Technology for Removal of Silicon Native Oxide Employing Hot NH3/NF3 Exposure", The Japan Society of Applied Physics, Part I, No. 8, Aug. 2002, pp. 5349-5358.

H. Nishino et al., "Damage-free selective etching of Si native oxides using NH3/NF3 and SF6/H2O down-flow etching", J. Appl. Phys. vol. 74, No. 2, Jul. 15, 1993, pp. 1345-1348.

Y. Yang et al., "Ultrahigh-selectivity silicon nitride etch process using an inductively coupled plasma source", J. Vac. Sci. Technol. A, vol. 16, No. 3, May/Jun. 1998, pp. 1582-1587.

Phan et al., Integrated Clean Process Using NF3/NH3 Remote Plasma for Nickle Silicide Formation,SEMICON Korea STS 2006, pp. 159-163.

S. Athavale et al., Molecular dynamics simulation of atomic layer etching of silicon, J. Vac. Sci. Technol. A, vol. 13, No. 3, May/Jun. 1995, pp. 966-971.

W. Natzle et al., "Trimming of hard-masks by Gaseous Chemical Oxide Removal (COR) for Sub-10nm Gates/Fins, for Gate Length Control and for Embedded Logic", 2004 IEEE/SEMI Advanced Semiconductor Manufacturing Conference, pp. 61-65.

Liu et al., "Modulating Etch Selectivity and Etch Rate of Silicon Nitride Thin Films," Novellus Systems, Inc., U.S. Appl. No. 12/002,085, filed Dec. 13, 2007.

Honda et al., "Chemical Dry Cleaning Technology for Reliable 65nm CMOS contact to $NiSi_x$," IITC-2005 paper9.4.

Okamura et al., "Low Damage Via Formation with Low Resistance by NH3 Thermal Reduction for Cu / Ultra Low-k Interconnects", 2004 IEEE, pp. 42-44.

Kim, et al., "New Contact Cleaning in HF & N2/H2 Microwave Plasma", Solid State Phenomena vol. 92, (2003), pp. 239-242.

Byun et al., The Effects of Reactive Precleaning (RPC+) on the Formation of Titanium Silicide by PECVD $TiCl_4$-Ti Deposition, and Its Thermal Stability, 2001, IEEE, pp. 222-224.

Taguwa, et al., "ICP-Ar/$II_2$ Precleaning and Plasma Damage-Free Ti-PECVD for Sub-Quarter Micron Contact of Logic with Embedded DRAM", Conference Proceedings USLI XV 2000, pp. 589-593.

Chang, et al., "Interface Characteristics of Selective Tungsten on Silicon Using a New Pretreatment Technology for ULSI Application", 1997 IEEE, pp. 738-743.

Park et al., "Low Damage in Situ Contact Cleaning Method by a Highly Dense and Directional ECR Plasma," Jpn J. Appl. Phys. vol. 35 (1996), pp. 1097-1101.

Schravendijk et al., "Protective Layer to Enable Damage Free Gap Fill," Novellus Systems, Inc., U.S. Appl. No. 12/002,171, filed Dec. 14, 2007.

Schravendijk et al., "Protective Layer to Enable Damage Free Gap Fill," Novellus Systems, Inc., U.S. Appl. No. 60/925,255, filed Apr. 18, 2007.

Liu et al., "Methods for Etching High Aspect Ratio Structures," Novellus Systems, Inc., U.S. Appl. No. 60/962,638, filed Jul. 30, 2007.

U.S. Notice of Allowance mailed Jul. 1, 2008 from U.S. Appl. No. 11/479,812 and Allowed Claims.

\* cited by examiner

METHODS FOR REMOVING SILICON NITRIDE AND OTHER MATERIALS DURING FABRICATION OF CONTACTS

CROSS-REFERENCE TO RELATED APPLICATIONS

This application claims priority under 35 USC 119(e) from U.S. Provisional Patent Application No. 60/905,782 naming Liu et al. as inventors, titled "Methods of Removing Silicon Nitride and Other Materials during Fabrication of Contacts and Interconnects" filed Mar. 7, 2007, which is herein incorporated by reference in its entirety and for all purposes. This application is related to U.S. patent application Ser. No. 11/479,812 filed Jun. 30, 2006, naming Liu et al. as inventors, titled "Adsorption Based Material Removal Process", which is incorporated herein by reference in its entirety and for all purposes. This application is also related to U.S. patent application Ser. No. 12/002,085 filed Dec. 13, 2007, naming Liu et al. as inventors, titled "Modulating Etch Selectivity and Etch Rate of Silicon Nitride thin Films", which is incorporated herein by reference in its entirety and for all purposes.

FIELD OF THE INVENTION

The present invention pertains to methods of removing layers of material on a partially fabricated integrated circuit. Specifically, the invention pertains to methods for removing silicon nitride and other materials during fabrication of contacts and interconnects.

BACKGROUND OF THE INVENTION

In a typical integrated circuit manufacturing process flow, metal is deposited onto a patterned dielectric (typically a silicon dioxide based material) to fill the vias and trenches formed in the dielectric layer. The resulting metallization layer is typically formed either directly on a layer carrying active devices (e.g., transistors), or on another metallization layer. The resulting metal-filled vias and trenches form the conductive pathways of an integrated circuit (IC) device. Contacts and interconnects are formed between active devices and metal-filled vias as well as between metal lines of adjacent metallization layers.

Fabrication of contacts and interconnects involves a contact-precleaning operation, which is usually performed after inter-layer dielectric (ILD) has been patterned to provide vias and trenches, but before the vias and trenches are filled with metal. Contact precleaning removes materials that can interfere with good contact between metal lines of adjacent metallization layers, or between metal lines and active devices. One of materials that may be difficult to remove during contact precleaning is silicon nitride, which is often used in IC fabrication as an etch stop layer. Currently there is a need for methods of removing silicon nitride from interconnects and contact holes.

SUMMARY

Methods for removing silicon nitride and elemental silicon during contact preclean process involve converting these materials to materials that are more readily etched by fluoride-based etching methods, and subsequently removing the converted materials by a fluoride-based etch. Specifically, silicon nitride and elemental silicon may be treated with an oxidizing agent, e.g., with an oxygen-containing gas in a plasma, or with $O_2$ or $O_3$ in the absence of plasma to produce a material that is more rich in Si—O bonds (that is, partially or completely converting silicon nitride or elemental silicon to a silicon oxide based material) and is more easily etched with a fluoride-based etch. Alternatively, silicon nitride or elemental silicon may be doped with a number of doping elements, e.g., hydrogen, to form materials which are more easily etched by fluoride based etches. The methods are particularly useful for precleaning contact vias residing in a layer of silicon oxide based material because use of described methods minimizes the unwanted increase of critical dimension of contact vias.

In one embodiment the substrate includes a plurality of contact vias residing in a layer of silicon oxide based material. Silicon nitride and/or elemental silicon may reside at the bottom portion of a contact via in such substrate, while via sidewalls comprise exposed silicon oxide based material. Elemental silicon, as used herein includes various forms of silicon, such as amorphous silicon. In some embodiments, elemental silicon is damaged during formation of the contact via, and needs to be removed during contact preclean process.

Many forms of silicon nitride are etched by fluoride-based methods only with difficulty, while silicon dioxide based materials are etched more readily. Therefore, when silicon nitride is etched by a fluoride based method during contact preclean process, large amounts of surrounding silicon oxide containing materials are inadvertently removed. This results in undesired increase in critical dimensions of the contact vias. In order to address this problem, silicon-containing materials that are not easily etched by fluoride-based chemistry are pre-treated and converted to materials which can be etched at rates which are comparable to etch rates of silicon oxide based materials.

According to one embodiment the treatment includes exposing the substrate to oxidizing agents. The oxidizing agents in one embodiment may include but are not limited to active species such as radicals, ions, and excited atoms or molecules that are capable of oxidizing the silicon-containing materials, e.g., increasing the amount of Si—O bonds in the material. The active species may be optically generated (e.g., using UV irradiation) or generated in a plasma discharge. A variety of plasma generating configurations may be used. For example, the plasma may be generated directly with the substrate serving as a part of one of the electrodes used for plasma generation. In another embodiment, a remote plasma may be used, with the substrate not being part of plasma-generating electrodes.

In some embodiments, treatment may include exposing the substrate to an oxygen-containing agent, such as $O_2$, $O_3$, $N_2O$, $NO$, $H_2O$, and $H_2O_2$, in a plasma discharge or using UV exposure. In some embodiments it may be sufficient to expose the substrate to an oxygen-containing gas, such as $O_2$ or $O_3$ without any additional excitation by plasma or irradiation. For example, silicon nitride may be converted to a more readily etchable material by exposing the substrate to ambient atmosphere. Yet in other embodiments, the conversion may be accomplished by exposing the substrate to aqueous solutions of reactants, e.g., solutions containing at least one of sulfuric acid, nitric acid, hydrogen peroxide, and ammonium hydroxide. Combinations of oxidizing agents, as known to those of skill in the art may also be used.

In other embodiments, doping elements may be implanted into the silicon-containing material (e.g., silicon nitride or elemental silicon) to make these materials more susceptible to fluoride-based etching. For example, these materials may be doped with hydrogen by exposing the substrate to active hydrogen species, such as excited atoms or molecules, as well as ions. Active species may be generated, according to one embodiment, by exposing a hydrogen-containing reactant to UV irradiation or to a plasma discharge. Examples of hydrogen containing reactants include but are not limited to hydrogen ($H_2$), ammonia ($NH_3$), and hydrazine ($N_2H_4$).

After the silicon-containing material is converted to a more etchable material, the substrate is subjected to a fluoride-based etching. The fluoride-based etch may be performed by a number of methods known to those of skill in the art. Both wet and dry fluoride-based etching methods may be used. Wet etching typically involves exposing the substrate to an aqueous solution of a fluoride etachant (e.g., aqueous HF). Dry methods may involve exposing the substrate to a vapor of fluoride salts (e.g., ammonium fluoride and ammonium bifluoride). Further, gaseous HF may be used for fluoride-based etching, when moisture is present. The fluoride etchant may be directly introduced into the process chamber containing the substrate, or can be generated within the chamber or outside the chamber from precursors. A number of methods for generating fluoride etchants can be used, including generation of an etchant with an assistance of a plasma discharge or using a thermal reaction. In one embodiment, fluoride etchant is formed by subjecting $NF_3$ gas to a remote plasma discharge, followed by reaction with $NH_3$ to form ammonium fluoride and/or ammonium bifluoride etchant. In another implementation, a mixture of $H_2$ and $NF_3$ is subjected to a plasma discharge to generate ammonium fluoride and/or bifluoride etchant. In yet another approach, ammonium fluoride and/or bifluoride etchant is obtained by a thermal reaction between $NH_3$ and $NF_3$ in the absence of plasma discharge.

In some embodiments, the etching is performed using Atomic Layer Removal method which is described in detail in commonly owned U.S. application Ser. No. 11/479,812, previously incorporated by reference. This method allows controlled removal of small amounts of materials with atomic-scale level of control. The control is achieved by producing the etchant on the substrate surface in the amount limited by the amount of adsorbed (or otherwise retained) precursor. For example in one embodiment the etching involves positioning the substrate in a process chamber configured for admission of gaseous reactants; exposing the substrate to gaseous ammonia and exposing the substrate to dry gaseous hydrogen fluoride. The substrate is exposed to these reagents sequentially with the chamber being purged or evacuated before admission of the next reactant. The order of admission of ammonia and hydrogen fluoride is not critical and can be changed as desired. Neither dry hydrogen fluoride nor ammonia alone etch the material on the substrate. However, the substrate surface adsorbs or otherwise retains the reactants to which it is exposed, and a reaction between ammonia and hydrogen fluoride occurs on the substrate and produces an etchant (ammonium fluoride and/or ammonium bifluoride) in an amount limited by the amount of adsorbed (or otherwise retained reactant). The fluoride etchant, therefore, removes a controlled amount of material, limited by the amount of fluoride etchant formed. It is noted that gaseous ammonia and dry HF may be introduced directly into the process chamber or may be generated from precursors using a plasma discharge. While in general ALR process can be preformed over a wide range of process conditions, in one embodiment it is preferable to perform the process at a pressure in the range of between about 1-15 mTorr and by maintaining the substrate at a temperature of between about 15-45° C.

The etching by-products obtained during fluoride-based etching can be removed by a variety of methods. For example, some by-products may be removed by applying energy to the substrate (e.g., via sublimation). In other embodiments, by-products may be removed by rinsing with deionized water or by sputtering (e.g., with inert gas plasma). In some embodiments (e.g., in an ALR approach) thermal desorption (e.g., sublimation) of by-products may be followed by aqueous rinsing of the wafer.

In general, there is a wide latitude in the types of apparatus and process conditions, one of skill in the art may use in implementing described methods. In some embodiments, it is possible and advantageous to perform both material conversion and fluoride-based etching in one process chamber. For example, any suitable apparatus configured for plasma generation and for admission of gaseous reactants may be used to treat the substrate with an oxygen-containing gas or a hydrogen-containing gas in a plasma and then subsequently perform dry fluoride-based etch. In other embodiments conversion of silicon-containing material and fluoride-based etching is performed in different process chambers.

These and other features and advantages of the invention will be described in more detail below with reference to the associated drawings.

DETAILED DESCRIPTION OF PREFERRED EMBODIMENTS

Introduction and Overview

Removal of silicon nitride presents several challenges, which become more pronounced as the dimensions of recessed features in IC devices continue to shrink. Silicon nitride is often more resistant to fluoride-based etching than the surrounding silicon dioxide based ILD, and therefore often requires more aggressive etching conditions. Removal of even very small amounts of etch-resistant silicon nitride from the contacts and interconnects, can inadvertently result in etching of substantial amounts of silicon dioxide based ILD material, which defines the dimensions of recessed features on a partially fabricated IC device. While such inadvertent etching may be tolerated in some device structures with relatively large dimensions of recesses, in those structures where dimensions are small, fluoride-based etching of etch resistant silicon nitride may lead to substantial increase in critical dimensions of vias and trenches defining the contacts. Such increase in critical dimensions is highly undesired, and should be avoided when possible.

This problem is herein addressed by providing new methods for removing silicon nitride from contacts and interconnects. In some embodiments, the provided methods allow removal of silicon nitride from the contacts with minimized change in critical dimensions of corresponding recesses. For example, etch resistant silicon nitride can be removed from the via, with little accompanying change in via diameter, e.g., a diameter increase not exceeding 20% of the initial diameter of the via.

"Silicon nitride" as used herein refers to material having the composition $Si_xN_y$, which may further include hydrogen and small amounts of doping elements, such as C, O, B, etc.

"Silicon dioxide based materials" refer to materials having a composition $Si_xO_y$, which may further include hydrogen and can be doped with carbon, fluorine, boron, phosphorus, etc. These materials include but are not limited to silicon dioxide, fluorosilicate glass (FSG), borosilicate glass (BSG) and low-k dielectrics, such as carbon-doped oxide (CDO), organic-based low-k dielectric materials and the like.

"Fluoride based etching methods" refer to etching methods relying on fluoride-silicon reaction, and include dry etching methods using such fluorides as HF, $NH_4F$, $NH_4HF_2$, etc. The reactive fluoride species can be formed in situ, e.g., thermally or in a plasma discharge. For example, according to some embodiments fluoride based etching involves flowing fluorine-containing gas, such as $NF_3$ together with hydrogen containing gas, such as $NH_3$ into a process chamber. The reactive HF, $NH_4F$, and $NH_4HF_2$ species are formed from $NF_3$ and $NH_3$, after the plasma discharge is ignited in the process chamber. In other embodiments, etching can be accomplished by flowing HF into the process chamber in the presence of catalytic amounts of moisture. Yet in other embodiments, the fluoride-based etchant can be formed on a substrate surface according to an atomic layer removal (ALR™) process flow. ALR™ process is described in detail in a commonly assigned U.S. application Ser. No. 11/479,812 filed on Jun. 30, 2006, entitled Adsorption Based Material Removal Process, naming Xinye Liu et al. as inventors, which is herein incorporated by reference. Other examples of fluoride-based etching processes are described in U.S. Pat. No. 5,282,925 issued Feb. 1, 1994 to Jeng et al. and in a US Patent publication No. 2005/0230350 published Oct. 20, 2005, naming Kao et al. as inventors, which are incorporated herein by reference in their entireties.

While methods provided herein can be applied to removal of any type of silicon nitride, they are particularly suitable for removing silicon nitride, which is resistant to fluoride-based etching. Etch selectivity, defined herein as a ratio of etch rate for silicon dioxide based material (e.g., ILD material) surrounding the recesses to etch rate of silicon nitride material to be removed, can be used as a measure of silicon nitride resistance to etching. While presented methods can be applied to different types of etching, in selected embodiments etch selectivity with respect to fluoride based etching will be discussed. The greater the selectivity value, the more resistant silicon nitride is to etching, compared to surrounding silicon dioxide based material. Depending on a particular structure and on a deposition method of a silicon nitride material, its etch selectivity can range from about 1:1 to 50:1 and higher. For example, certain silicon nitride films deposited by low pressure chemical vapor deposition (LPCVD) have an etch selectivity of about 50:1. Typically etching of such films requires long reaction times, and may result in unacceptable change of critical dimensions of the cleaned contact.

Fluoride-based etching of silicon nitride having an etching selectivity greater than 3:1, and particularly greater than 10:1 is particularly damaging to dimensions of recessed features at a 65 nm technology node and at more advanced nodes.

This problem can be illustrated by the following example. When 50 Å of silicon nitride material having a 2:1 etch selectivity are removed from the via bottom, the etching process will inadvertently remove 100 Å of silicon dioxide based material from the via sidewall, provided that the etching process is 100% conformal. The total diameter change of the contact would be 200 Å. If 50 Å of silicon nitride material having a 10:1 selectivity need to be removed, the diameter change of the contact would be 1000 Å, which is not acceptable at 65 nm technologies.

Methods provided herein can remove silicon nitride having high fluoride etch resistance, e.g., silicon nitride having a fluoride etch selectivity greater than 10:1 or 50:1.

Figure 1:
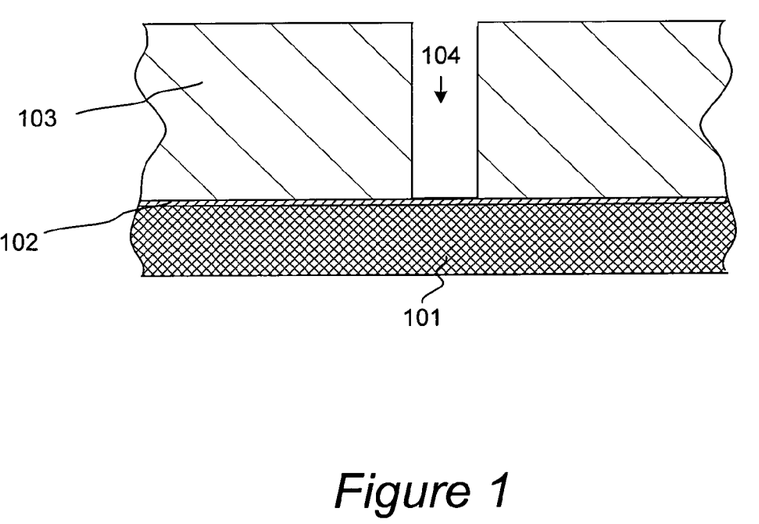
FIG. 1 shows a cross sectional depiction of a device structure illustrating a contact via prior to contact pre-clean operation.

In order to frame the context of this invention, pre-cleaning of an example contact will be illustrated. Referring to FIG. 1, a cross-sectional depiction of a partially fabricated device is shown. In this example, silicon nitride etch stop layer 102 is residing on top of a layer of an active device material 101 (containing e.g., amorphous silicon, or metal silicide). A layer of silicon dioxide-based dielectric 103 is residing on top of a silicon nitride etch stop layer 102. A contact hole 104 is cut within the layer of dielectric 103, such that silicon nitride 102 is exposed at the bottom of the contact hole.

In one embodiment, provided methods can be used to remove exposed silicon nitride 102 during pre-clean of the contact. For example, a bulk quantity of greater than 100 Å of silicon nitride can be removed, and the active device material 101 can be exposed, after the pre-clean is complete.

In another embodiment the bulk of exposed silicon nitride 102 is removed by another method known in the art, such as reactive ion etching (RIE). In one embodiment, bulk silicon nitride removal method does not remove all of the silicon nitride from the contact, but leaves some residual amount of silicon nitride at the bottom of the contact hole 104. For example, less than 100 Å or less than 40 Å may remain. In this embodiment, provided methods are used to remove this residual amount of silicon nitride. Provided methods can controllably remove less than 100 Å, e.g., between about 20-40 Å of silicon nitride material from the contact.

In yet another embodiment exposed silicon nitride 102 is completely removed by known methods, such as RIE, and some of the underlying active device material 101 is also damaged during such bulk removal process (overetching scenario). In this case provided methods can be used to remove the damaged material, such as amorphous silicon or metal silicide from the contact surface.

After the contact has been pre-cleaned it is typically filled with metal, such as tungsten, and the like.

It is understood that contact preclean process is described to illustrate one possible application of provided methods, and that these methods are not limited to contact preclean context and can be used in a variety of other processing methods, including dual and single Damascene processing. Example use of provided methods in a dual Damascene context will be described. Dual Damascene process is described in detail, for example, in U.S. Pat. No. 6,607,977 issued Aug. 19, 2003, naming Rozbicki et al. as inventors, which is herein incorporated by reference for all purposes.

Figure 2:
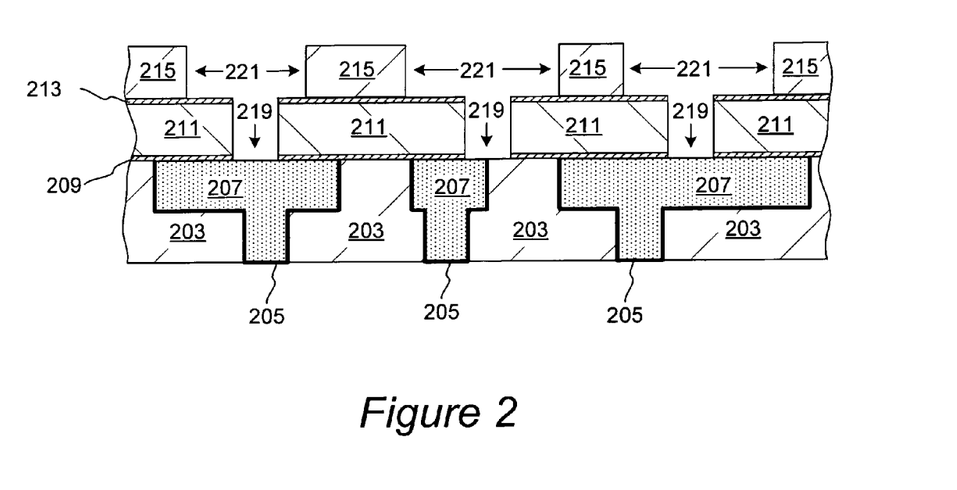
FIG. 2 shows a cross sectional depiction of a device structure created during a copper dual Damascene fabrication process.

Presented in FIG. 2 is a cross sectional depiction of a partially fabricated dual Damascene structure. In the presented example, copper lines 207 are inlayed into a layer of dielectric 203 (e.g., a carbon-doped silicon dioxide dielectric). The metal lines 205 are lined with a diffusion barrier 205 (e.g., a Ta/TaN bi-layer) at the bottom and on the sides. A dielectric diffusion barrier or an etch stop material 209 resides on top of metal lines 207 and on a dielectric layer 203. Such layer can be composed of doped or undoped silicon nitride or silicon carbide. A layer of inter-metal dielectric (e.g., carbon-doped silicon dioxide) 211 resides on top of a dielectric diffusion barrier layer 209. An etch stop layer 213, composed of doped or undoped silicon nitride or silicon carbide is stacked on top of dielectric layer 211. The final layer of the Damascene stack is the dielectric layer 215 (e.g., carbon-doped silicon dioxide), residing on top of an etch stop layer 213. Trenches 221 and vias 219 are formed within dielectric layers 211 and 215. Silicon nitride or silicon carbide material of layers 209 and 213 is selectively removed during formation of recesses and during interconnect pre-cleaning to afford a structure presented in FIG. 2. The silicon nitride and/or silicon carbide materials can be removed by methods provided herein, or, in some embodiments, the bulk of layer 209 can be removed by reactive ion etching (ME), while residual amount of material from layer 209 can be removed by methods provided herein during an interconnect pre-clean operation.

The methods presented herein are particularly suitable for removal of residual etch-resistant silicon nitride. Further, these methods are particularly advantageous for cleaning the vias 219 shown in FIG. 2 from silicon nitride material remaining from layers 209. Cleaning of contacts between metal lines 207 and vias 219 is performed after the recesses have been formed. In some embodiments, layers 213 and 209 may be composed of different materials, and exposed layer 209 can be removed in bulk by provided methods without removing material of layer 213. In some embodiments, bulk amounts of exposed layer 209 material are removed by methods known to those of skill in the art, while residual under-etched amounts of silicon nitride are removed by the methods described herein.

Efficient contact cleaning at the processing stage depicted by FIG. 2 is important for ensuring good ohmic contact between the conductive layers. It is understood that presented methods are not limited to cleaning of interconnects between metallization layers and to cleaning of contacts, and can be applied in any type of processing, where removal of silicon nitride and other materials having high etch selectivity with respect to silicon dioxide based materials, is desired.

In particular embodiments, provided methods are particularly advantageous for controlled removal of small amounts of silicon nitride and other materials, e.g., for removal of silicon nitride layers having thickness of less than about 100 Å, e.g., between about 20 and 40 Å.

In some embodiments, provided methods are used to remove undoped silicon nitride, or silicon nitride having only small amount of doping elements. Such types of silicon nitride typically have high etch selectivity, and are therefore particularly difficult to remove using conventional methods.

Methods for Removing Silicon Nitride

Removal of silicon nitride can be implemented, in some embodiments, by converting low etch rate silicon nitride to a material that has a high etch rate. For example, a silicon nitride material having an etch selectivity of greater than about 3:1 can be converted to a material having an etch selectivity of about 1:1. In general, etch rate and selectivity values herein refer to any type of etching. In particular embodiments, they refer to fluoride-based etching, and in more specific embodiments to gas phase fluoride-based etching Wet fluoride etching methods and other etching techniques are also within the scope of embodiments provided herein.

Figure 3:
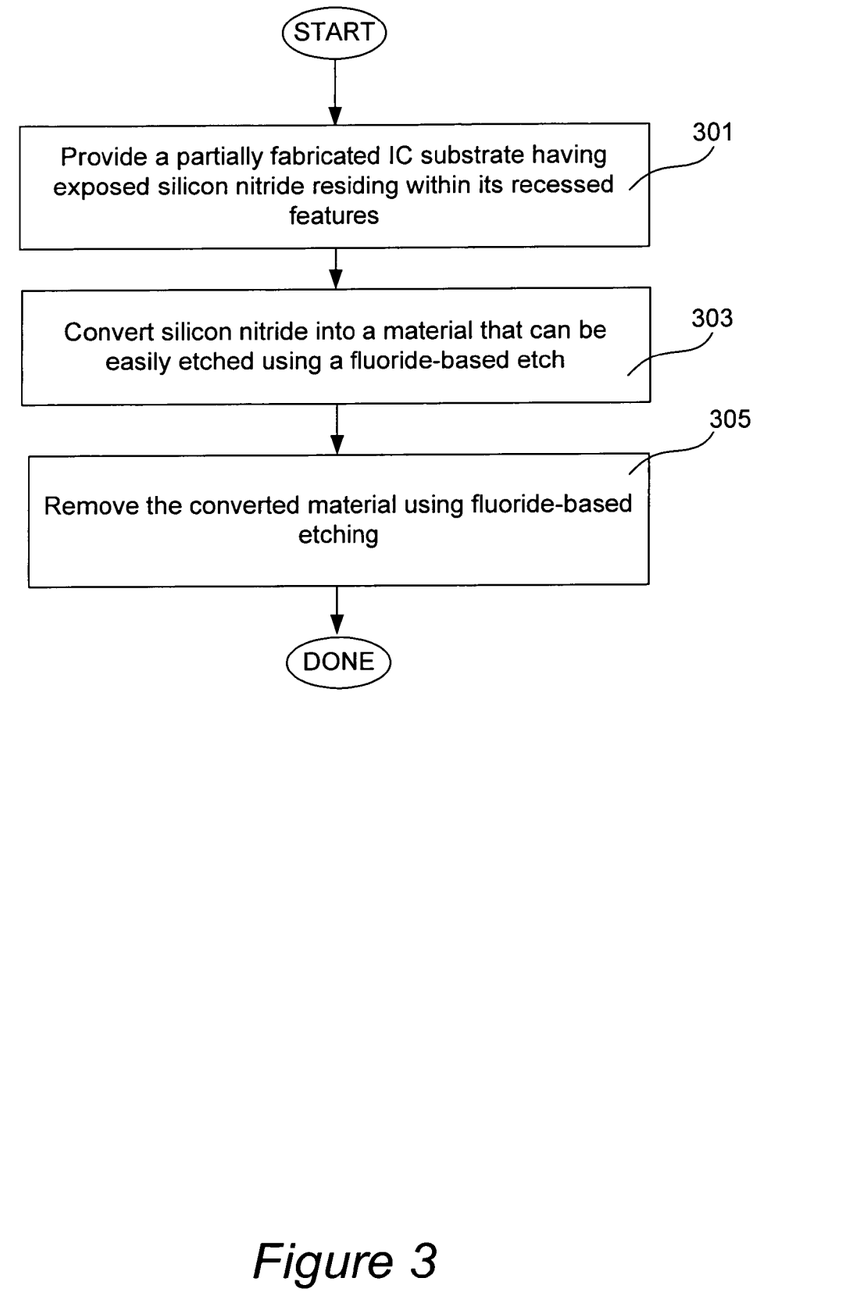
FIG. 3 presents a process flow diagram for a method of removing silicon nitride during contact cleaning.

According to an example process flow presented in FIG. 3, a partially fabricated integrated circuit device having recessed features, such as vias and trenches, is provided. The device has silicon nitride material residing within the recessed features, e.g., at the via bottoms, as shown in the process block 301. Typically, active devices or metal lines are underlying the recessed features.

In order to clean the contacts, silicon nitride material is first converted to a material that has a higher etching rate, as shown in the process block 303. For example, it is converted to a material that has a comparable rate of etching to the surrounding ILD material, which is typically silicon dioxide based material.

Conversion can be accomplished by a variety of methods. In some embodiments, such conversion does not affect other material located on the wafer surface. In one embodiment, silicon nitride is treated with an oxygen containing gas and is oxidized to a silicon dioxide based material, e.g., to silicon dioxide. Suitable oxygen containing gases include but are not limited to $O_2$, $O_3$, $H_2O$, $N_2O$, and NO. Conversion can be accomplished using plasma discharge, UV treatment, thermal treatment, etc.

For example, in some embodiments silicon nitride is converted to silicon dioxide based material using $O_2$ plasma or $H_2O$ plasma. In some embodiments treatment with $O_2$ plasma is preferred. Some examples of silicon nitride oxidation conditions are provided in US Patent Publication No. 2006/0105516 filed Dec. 27, 2005 by Belyansky et al., which is attached and is incorporated by reference in its entirety. Different conditions may be used in other embodiments of plasma-assisted oxidation. In some embodiments, $O_3$ treatment with or without assistance of UV light, can be employed. Yet in other embodiments, aqueous oxidation processes using strong oxidizing agents such as $H_2SO_4$, $H_2O_2$, etc., may be used. After the silicon nitride is converted to $SiO_2$, the etch selectivity becomes essentially 1:1. The critical dimension change is thus minimized.

In another embodiment, conversion of silicon nitride to a material having higher etching rate, involves modifying silicon nitride structure by introducing elements other than silicon and nitrogen into the silicon nitride structure. For example, when oxygen is introduced to afford a $Si_xO_yN_z$ composition, the etch rate increases, while the selectivity decreases. In another embodiment, silicon nitride may be enriched with hydrogen, forming $Si_xN_yH_z$. Formation of increased amounts of N—H bonds renders the material more reactive to certain etching conditions, and thereby decreases the selectivity and reduces the change in critical dimensions during etching.

The modified silicon nitride may be deposited in a modified state or it may be modified by introduction of other materials after the initial deposition. Post-deposition modification may be accomplished by implanting elements using conventional processes. For example, boron, phosphorus, oxygen, etc, may be implanted in this manner. In some embodiments, the silicon nitride layer may be modified without implanting, as by bombardment with argon ions, for example.

After the silicon nitride has been modified, it is subjected to etching, as shown in the process block 305. In some embodiments, fluoride based etching methods such as those described above are employed. In some embodiments, gas-phase fluoride etching methods are preferably used. In these embodiments, solid fluoride etchants, such as $NH_4F$ and $NH_4HF_2$ may be deposited on a substrate from gas-phase precursors; or gas-phase fluorides (such as HF) may be used as etchants. Yet in other embodiments, wet fluoride etching may be performed.

In a particular embodiment ALR™ process flow is used to etch the treated silicon nitride. In an ALR process flow, a thin layer of etchant precursor, such as HF is adsorbed on a substrate, followed by introduction of a second etchant precursor, e.g., $NH_3$. The precursors react to form a controlled amount of etchant, e.g., $NH_4F$ and $NH_4HF_2$, which etches the treated silicon nitride (now converted to, e.g., silicon dioxide or silicon oxynitride) at substantially the same or similar rate as it etches the surrounding silicon dioxide based ILD. A U.S. patent application Ser. No. 11/479,812 previously incorporated by reference, describes details of ALR™ process and is herein attached. ALR™ process is preferred in some embodiments for controlled removal of small amounts of material, e.g., for removal of less than about 100 Å, e.g., between about 10-40 Å. Two other patents (U.S. Pat. No. 5,282,925 and US Patent Application Publication No: 2005/0230350 previously incorporated by reference) illustrating various embodiments of fluoride based etching methods, which can be used in conjunction with provided methods are also attached.

After the converted silicon nitride has been removed, the process is completed. In one particular example, etch resistant silicon nitride film deposited by LPCVD was treated with $O_2$ plasma, and the resulting silicon dioxide was removed using ALR™ process.

Presented methods compare favorably to other contact cleaning methods because they can be universally applied to various types of silicon nitride materials having different etch selectivities. For example, in conventional methods etching chemistry and conditions had to be tailored to a particular type of silicon nitride that had to be removed. Even when etching conditions were adjusted, removal of silicon nitride having high etch selectivity, could still lead to inadvertent removal of substantial amounts of adjacent silicon dioxide based ILD. The described methods can convert a wide variety of types of silicon nitride to an easily etchable material, and thereby large critical dimension change can be avoided.

Further, the described concept can be applied to etching of other materials beyond silicon nitride. According to one example, the presented concept can be applied to removal of silicon carbide, which is also a challenging material to be removed. Silicon carbide can be modified or converted to an easily etchable material, prior to removal. For example, silicon carbide can be oxidized to silicon dioxide based material using methods presented herein. Silicon dioxide based material can then be removed using a variety of etching techniques, e.g., by fluoride-based etching In another example, presented methods can be applied to removal of amorphous silicon or metal silicide from etched contacts. Amorphous silicon formed by over-etching in the contact opening process cannot be etched by fluoride-based selective gas phase etching or by typical wet clean methods. However, if silicon surface is oxidized to form silicon dioxide, this oxide layer can be easily removed as described above.

In addition, the invention can be applied to etching techniques beyond fluoride dry etch techniques. For example, the invention can be employed to remove modified layers using wet etch technologies and even reactive ion etching in some cases.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method of removing silicon nitride from a partially fabricated semiconductor device substrate having a plurality of recessed features formed in a layer of silicon oxide based material, the method comprising:
   (a) providing the substrate comprising a plurality of recessed features formed in the layer of silicon oxide based material, the device further comprising exposed silicon nitride;
   (b) treating the substrate to convert the exposed silicon nitride into a material that has a higher etch rate with respect to fluoride-based etching; and
   (c) etching the converted material using a fluoride-based etch process.

2. The method of claim 1, wherein the recessed features comprise contact vias, and wherein removing silicon nitride is performed during contact precleaning process.

3. The method of claim 1, wherein the substrate provided in (a) comprises exposed silicon nitride residing at a bottom portion of a contact via and a layer of exposed silicon oxide based material.

4. The method of claim 1, wherein (b) comprises treating the substrate with active species selected from the group consisting of radicals, ions, excited molecules and mixtures thereof, wherein the active species is generated in a plasma from a gas selected from the group consisting of $O_2$, $O_3$, $N_2O$, $H_2O$ and NO.

5. The method of claim 1, wherein (b) comprises treating the substrate with a reactant in a plasma, wherein the plasma is one of a direct plasma or a remote plasma.

6. The method of claim 1, wherein (b) comprises treating the substrate with an aqueous solution comprising at least one of the reagents selected from the group consisting of hydrogen peroxide, sulfuric acid, nitric acid, and ammonium hydroxide.

7. The method of claim 1, wherein (b) and (c) are performed in one process chamber.

8. The method of claim 1, wherein (b) comprises exposing the substrate to an oxidizing agent.

9. The method of claim 8, wherein the oxidizing agent comprises oxygen-containing active species selected from the group consisting of ions, radicals, excited molecules or mixtures thereof generated in a plasma discharge or during UV irradiation.

10. The method of claim 8, wherein exposing the substrate to an oxidizing agent partially or completely converts silicon nitride to a silicon oxide based material.

11. The method of claim 8, wherein (b) comprises exposing the substrate to an oxygen-containing reactant in an absence of plasma discharge, optical or thermal excitation.

12. The method of claim 1, wherein (b) comprises exposing the substrate to radicals, ions, excited molecules or mixtures thereof formed from a hydrogen containing reactant.

13. The method of claim 12, wherein the hydrogen containing reactant is selected from the group consisting of $H_2$, $NH_3$, and $N_2H_4$.

14. The method of claim 13 comprising generating active species from the hydrogen containing reactant in a plasma discharge or by UV irradiation.

15. The method of claim 1, wherein (c) comprises exposing the partially fabricated device to an etchant selected from the group consisting of ammonium fluoride, ammonium bifluoride, aqueous HF, and gaseous HF with a catalytic amount of moisture.

16. The method of claim 15, further comprising generating the fluoride etchant from precursors using at least one of: reaction between $H_2$ and $NF_3$ in a plasma discharge; thermal reaction between $NH_3$ and $NF_3$ in the absence of plasma discharge; and a plasma reaction of $NF_3$ followed by a reaction with $NH_3$.

17. The method of claim 1, wherein (c) comprises:
   (i) positioning the partially fabricated device in a process chamber configured for admission of gaseous reactants;
   (ii) exposing the substrate to gaseous $NH_3$;
   (iii) exposing the substrate to dry gaseous HF, wherein (i) and (ii) are performed sequentially and wherein the process chamber is purged or evacuated between (ii) and (iii);
   (iii) forming a fluoride etchant on the substrate surface in an amount limited by the amount of $NH_3$ or HF retained by the substrate surface, wherein the fluoride etchant is selected from the group consisting of ammonium fluoride, ammonium bifluoride, and mixtures thereof;

(iv) etching a controlled amount of converted silicon nitride, wherein the etched amount is limited by the amount of formed fluoride etchant.

18. The method of claim 17, further comprising removing etching by-products, wherein removing comprises sublimating reaction by-products.

19. A method of removing elemental silicon from a partially fabricated semiconductor device having a plurality of recessed features formed in a layer of silicon oxide based material, the method comprising:
(a) providing the semiconductor device comprising a plurality of recessed features formed in the layer of silicon oxide based material, the device further comprising elemental silicon;
(b) treating the substrate to convert the elemental silicon into a material that can be etched using a fluoride-based etching; and
(c) etching the converted material using the fluoride-based etch process.

20. The method of claim 19, wherein (b) comprises oxidizing elemental silicon to a silicon oxide based material by exposing the substrate to an oxidizing agent.

* * * * *